US012671329B2

(12) United States Patent　　　(10) Patent No.: US 12,671,329 B2

Kansaku　　　(45) Date of Patent: Jun. 30, 2026

(54) POWER-SUPPLY CONTROL APPARATUS, SWITCHED-MODE POWER SUPPLY, AND VEHICLE

(71) Applicant: ROHM CO., LTD., Kyoto (JP)

(72) Inventor: Kiyoshi Kansaku, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 270 days.

(21) Appl. No.: 18/635,142

(22) Filed: Apr. 15, 2024

(65) Prior Publication Data

US 2024/0356439 A1　　Oct. 24, 2024

(30) Foreign Application Priority Data

Apr. 19, 2023　(JP) ................................. 2023-068583

(51) Int. Cl.
　　*H03K 3/037*　　(2006.01)
　　*H02M 3/156*　　(2006.01)
(52) U.S. Cl.
　　CPC ............ *H02M 3/156* (2013.01); *H03K 3/037* (2013.01)

(58) Field of Classification Search
　　CPC ............................... H02M 3/156; H03K 3/037
　　See application file for complete search history.

(56) References Cited

U.S. PATENT DOCUMENTS

| | | | | |
|---|---|---|---|---|
| 9,059,632 | B2 * | 6/2015 | Li | H02M 3/1588 |
| 11,482,933 | B2 * | 10/2022 | Fukumoto | H02M 1/08 |
| 12,483,134 | B2 * | 11/2025 | Biziitu | H02M 1/0025 |
| 2024/0380306 | A1 * | 11/2024 | Kansaku | H02M 1/36 |
| 2024/0380312 | A1 * | 11/2024 | Kansaku | H02M 1/36 |

FOREIGN PATENT DOCUMENTS

JP　　　2008-067454　　　3/2008

* cited by examiner

*Primary Examiner* — Adolf D Berhane
(74) *Attorney, Agent, or Firm* — Fish & Richardson P.C.

(57) ABSTRACT

A power-supply control apparatus includes a controller that is configured to perform duty control on a switch device which forms an output stage of a switched-mode power supply which is configured to generate an output voltage from an input voltage. The controller has an OFF-skip function to skip cyclic OFF transitions of the switch device. The controller keeps the switch device turned ON by ignoring a reset signal based on feedback control on the output voltage under a state in which the OFF-skip function is implemented.

10 Claims, 15 Drawing Sheets

B

POWER-SUPPLY CONTROL APPARATUS, SWITCHED-MODE POWER SUPPLY, AND VEHICLE

CROSS-REFERENCE TO RELATED APPLICATIONS

This application is based on and claims the benefit of priority from Japanese Patent Application No. 2023-068583 filed on Apr. 19, 2023, the contents of which are hereby incorporated by reference.

BACKGROUND OF THE INVENTION

1. Technical Field

The present disclosure relates to a power-supply control apparatus, a switched-mode power supply, and a vehicle.

2. Description of Related Art

Hitherto, switched-mode power supplies that generate a desired output voltage from an input voltage have been used in various applications.

Note that, as a related-art example of these power supplies, there may be mentioned Patent Literature 1 (Japanese Patent Application Laid-open No. 2008-67454) by the applicant of this application.

In this context, in related-art switched-mode power supplies (in particular, power-supply control apparatuses to be used therein), there is still room for improvement of OFF-skip control.

DETAILED DESCRIPTION

<Switched-Mode Power Supply (Overall Configuration)>

Figure 1:
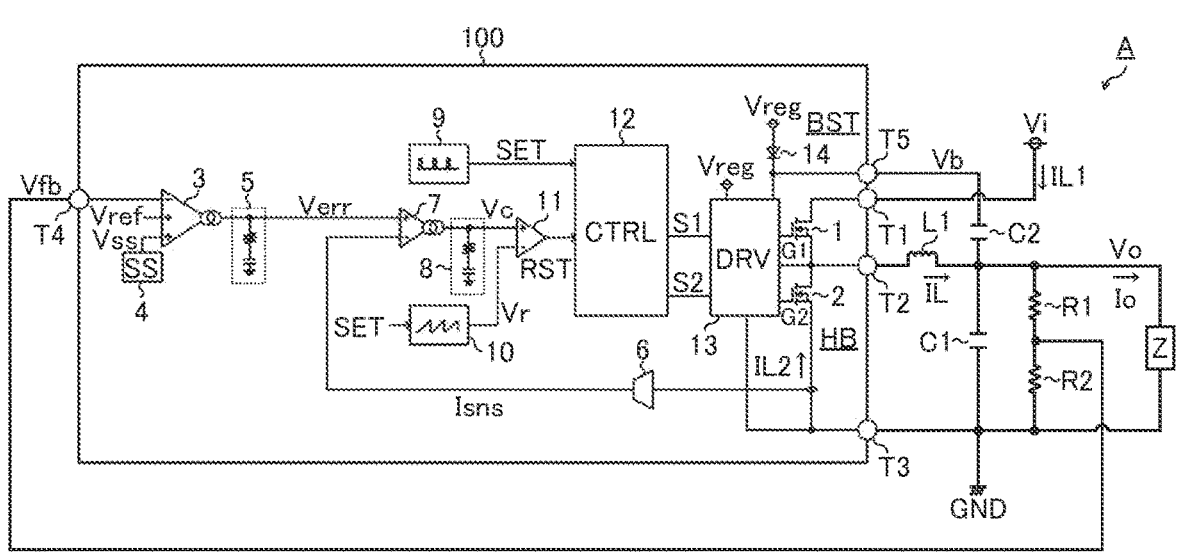
FIG. 1 is a diagram showing an overall configuration of a switched-mode power supply.

FIG. 1 is a diagram showing an overall configuration of a switched-mode power supply A. The switched-mode power supply A according to an embodiment of the present disclosure is a step-down DC/DC converter that generates an output voltage Vo from an input voltage Vi (Vo<Vi), and that supplies the output voltage Vo to a load Z. As shown in FIG. 1, the switched-mode power supply A includes a power-supply control apparatus 100, and various discrete components that are attached thereto (such as an inductor L1, capacitors C1 and C2, and resistors R1 and R2).

The power-supply control apparatus 100 is a semiconductor integrated circuit (what is called a power-supply control IC [Integrated Circuit]) that is configured to control a half-bridge output stage HB (including an output device 1 and a rectifying device 2 described below) of the switched-mode power supply A.

Note that, the power-supply control apparatus 100 includes external terminals T1, T2, T3, T4, and T5 as means for establishing electrical connection to an outside of the apparatus. The external terminal T1 is a power supply terminal. The external terminal T2 is a switch output terminal. The external terminal T3 is a ground terminal. The external terminal T4 is a feedback input terminal. The external terminal T5 is a boot-strap terminal. As a matter of course, external terminals other than the above-mentioned ones may be provided to the power-supply control apparatus 100.

The connection of the power-supply control apparatus 100 to the outside is described. The external terminal T1 is connected to a node to which the input voltage Vi is applied. The external terminal T2 is connected to a first end of the inductor L1. The external terminal T3 is connected to a node to which a ground voltage GND (=0 V) is applied. The external terminal T4 is connected to a first end of each of the resistors R1 and R2. The external terminal T5 is connected to a first end of the capacitor C2. All a first end of the capacitor C1 and a second end of each of the inductor L1, the capacitor C2, and the resistor R1 are connected to a node to which the output voltage Vo is applied (that is, first end of the load Z). A second end of each of the capacitor C1, the resistor R2, and the load Z is connected to a node to which the ground voltage GND is applied.

<Power-Supply Control Apparatus>

Next, with reference to FIG. 1, an internal configuration of the power-supply control apparatus 100 is described. The power-supply control apparatus 100 includes the output device 1, the rectifying device 2, an error amplifier 3, a soft-start circuit 4, a phase compensation circuit 5, a current-detecting circuit 6, a gm amplifier 7, a phase compensation circuit 8, an oscillator 9, a ramp-signal generating circuit 10, a comparator 11, a controller 12, a driver 13, and a diode 14.

The output device 1 and the rectifying device 2 may each be an N-channel MOSFET [Metal Oxide Semiconductor Field Effect Transistor]. The N-channel MOSFET is generally lower in ON-resistance value than P-channel type MOSFETs of the same size. Thus, use of the N-channel MOSFETs as the output device 1 and the rectifying device 2 is suited to high-voltage and high-current applications.

A drain of the output device 1 is connected to the external terminal T1. Both a source of the output device 1 and a drain of the rectifying device 2 are connected to the external terminal T2. A source of the rectifying device 2 is connected to the external terminal T3. Gates of the output device 1 and the rectifying device 2 are connected respectively to ends from which gate drive signals G1 and G2 are applied. The output device 1 and the rectifying device 2 that are connected in such a manner function respectively as an upper switch device and a lower switch device that form the half-bridge output stage HB of the switched-mode power supply A.

Note that, the output device 1 and the rectifying device 2 are complementarily switch-driven in response to the gate drive signals G1 and G2. The word "complementarily" used herein should be broadly understood to encompass not only a case where ON/OFF states of the output device 1 and the rectifying device 2 are completely inverted, but also a case where a simultaneous OFF period of both the devices (what is called "dead time") is provided.

For example, if the gate drive signal G1 is at high level (=Vb) and the gate drive signal G2 is at low level (=GND), the output device 1 is turned ON, and the rectifying device 2 is turned OFF. As a result, an upper inductor current IL1 flows through a current path from the external terminal T1 to the external terminal T2 via the output device 1, and the inductor L1 is charged with electrical energy. This state corresponds to an ON period Ton of the half-bridge output stage HB.

Meanwhile, if the gate drive signal G1 is at low level (=Vsw) and the gate drive signal G2 is at high level (=Vreg), the output device 1 is turned OFF, and the rectifying device 2 is turned ON. As a result, until the electrical energy stored in the inductor L1 is depleted, a lower inductor current IL2 continues to flow through a current path from the external terminal T3 to the external terminal T2 via the rectifying device 2. This state corresponds to an OFF period Toff of the half-bridge output stage HB.

In this way, the switch drive of the half-bridge output stage HB is repeated by the power-supply control apparatus 100. With this, a square-wave switch voltage Vsw is generated at the external terminal T2. Thus, by smoothing this switch voltage through the inductor L1 and the capacitor C1, a direct-current output voltage Vo is obtained.

Note that, both the output device 1 and the rectifying device 2 may be attached to the power-supply control apparatus 100. In that case, respective external terminals for outputting the gate drive signals G1 and G2 to the outside are required. In addition, the output device 1 and the rectifying device 2 may each be an N-channel IGBT [Insulated Gate Bipolar Transistor].

Alternatively, the rectifying device 2 may be a diode. In other words, a rectification method for the switched-mode power supply A need not necessarily be a synchronous rectification method, and a diode rectification method may be employed.

In addition, an output stage of the switched-mode power supply A need not necessarily be of a step-down type, and may be of a step-up type, a step-up/down type, or an inversion type (negative output type).

The error amplifier 3 (corresponding to a first amplifier) generates an error signal Verr in accordance with a difference between an either lower one of a predetermined reference voltage Vref and a soft-start voltage Vss that are input respectively to its two non-inverting input ends (+), and a feedback voltage Vfb that is input to its inverting input end (−) via the external terminal T4 (that is, voltage generated by dividing the output voltage Vo). The error amplifier 3 may be an gm amplifier of a current-output type. For example, if Vfb<Vref (or Vfb<Vss), current is caused to flow from the error amplifier 3 into the phase compensation circuit 5. As a result, the error signal Verr is pulled up. In contrast, if Vfb>Vref (or Vfb>Vss), the current is drawn from the phase compensation circuit 5 into the error amplifier 3. As a result, the error signal Verr is pulled down.

The soft-start circuit 4 generates the soft-start voltage Vss that mildly rises with a predetermined slope at a time when the switched-mode power supply A is activated or reactivated.

The phase compensation circuit 5 may be an RC circuit that is connected between an output end and a ground end of the error amplifier 3. Note that, both a capacitance value and a resistance value that make up the phase compensation circuit 5 may be set as appropriate in consideration of gain of a voltage feedback loop. In addition, a part or an entirety of the phase compensation circuit 5 may be attached to the power-supply control apparatus 100.

The current-detecting circuit 6 generates a current-detecting signal Isns in accordance with current that flows through the half-bridge output stage HB (such as the lower inductor current IL2).

The gm amplifier 7 (corresponding to a second amplifier) generates a control signal Vc in accordance with a difference between the error signal Verr that is input to its non-inverting input end and the current-detecting signal Isns that is input to its inverting input end (−). For example, if Verr>Isns, current is caused to flow from the gm amplifier 7 into the phase compensation circuit 8. As a result, the control signal Vc is pulled up. In contrast, if Verr<Isns, the current is drawn from the phase compensation circuit 8 into the gm amplifier 7. As a result, the control signal Vc is pulled down.

In this way, the current-detecting circuit 6 and the gm amplifier 7 enable current feedback control (what is called "current mode control"). Thus, load response characteristics of the switched-mode power supply A are increased. Note that, as a topology of the current feedback control, various methods other than the method of using the gm amplifier 7 (such as a method of adding the current-detecting signal Isns to a ramp signal Vr) can be employed.

The phase compensation circuit 8 may be an RC circuit that is connected between an output end and a ground end of the gm amplifier 7. Note that, both a capacitance value and a resistance value that make up the phase compensation circuit 8 may be set as appropriate in consideration of gain of a current feedback loop. In addition, a part or an entirety of the phase compensation circuit 8 may be attached to the power-supply control apparatus 100.

The oscillator 9 generates a set signal SET at a predetermined switching frequency Fsw SET.

The ramp-signal generating circuit 10 generates, in synchronization with the set signal SET, the ramp signal Vr in a triangular wave form or a sawtooth wave form.

The comparator 11 generates a reset signal RST by comparing the control signal Vc that is input to its non-inverting input end (+) from the gm amplifier 7 and the ramp signal Vr that is input to its inverting input end (−) from the ramp-signal generating circuit 10 to each other. Thus, the reset signal RST is at high level if Vc>Vr, and at low level if Vc<Vr.

The controller 12 generates gate control signals S1 and S2 so that switching control on the half-bridge output stage HB (specifically, duty control on the output device 1) is performed in response to the set signal SET and the reset signal RST. The controller 12 determines a timing to turn on the output device 1 basically in response to the set signal SET. In addition, the controller 12 determines a timing to turn OFF the output device 1 basically in response to the reset signal RST.

Note that, the controller 12 has not only the basic functions as described above, but also various additional functions (such as a function to prevent backflow under low load, and a function to shut down outputs in case of detecting abnormalities).

In addition, the controller 12 also has, for example, an OFF-skip function to skip cyclic OFF transitions of the output device 1 under a state in which a difference between the input voltage Vi and the output voltage Vo is small (function to divide the switching frequency Fsw). This function is described in detail below.

The driver 13 generates the gate drive signals G1 and G2 in response to the gate control signals S1 and S2. For example, the driver 13 sets the gate drive signal G1 to the high level (=Vb) under a state in which the gate control signal S1 is at the high level (=Vreg), and sets the gate drive signal G1 to the low level (=Vsw) under a state in which the gate control signal S1 is at the low level (=GND). In addition, for example, the driver 13 sets the gate drive signal G2 to the high level (=Vreg) under a state in which the gate control signal S2 is at the high level (=Vreg), and sets the gate drive signal G2 to the low level (=GND) under a state in which the gate control signal S2 is at the low level (=GND).

An anode of the diode 14 is connected to a node to which an internal power-supply voltage Vreg is applied. A cathode of the diode 14 is connected to the external terminal T5 (that is, a node to which a boost voltage Vb is applied). The diode 14 that is connected in such a way forms a boot-strap circuit BST cooperatively with the above-described capacitor C2.

Operation of the boot-strap circuit BST is briefly described. Under a state in which the output device 1 is turned OFF and the rectifying device 2 is turned ON, the switch voltage Vsw at the external terminal T2 is at the low level (=GND). Thus, the diode 14 is biased forward. With this, the capacitor C2 is charged by the internal power-supply voltage Vreg. At this time, the boost voltage Vb has a voltage value obtained by subtracting a forward drop voltage Vf of the diode 14 from the internal power-supply voltage Vreg (=Vreg-Vf).

Meanwhile, under a state in which the output device 1 is turned ON and the rectifying device 2 is turned OFF, the switch voltage Vsw rises from the low level (=GND) to high level (=Vi). At this time, by the principle of conservation of charge of the capacitor C2, the boost voltage Vb is also pulled up as much as the switch voltage Vsw has risen. In other words, the boost voltage Vb rises to be higher (=Vi+Vreg-Vf) than the input voltage Vi by an inter-end voltage (=Vreg-Vf) of the capacitor C2.

In this way, the boot-strap circuit BST generates the boost voltage Vb by charging the capacitor C2 under the state in which the output device 1 is turned OFF. The boost voltage Vb is supplied as drive voltage for the output device 1 to the driver 13. Thus, the driver 13 can increase the high level (that is, an ON voltage for turning ON the output device 1) of the gate drive signal G1 to be higher than the input voltage Vi. As a result, the output device 1 can be reliably turned ON.

<Controller (First Embodiment)>

Figure 2:
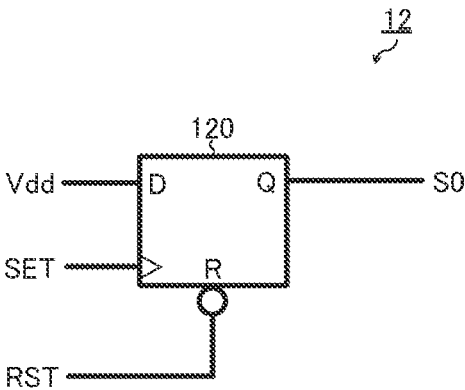
FIG. 2 is a diagram showing a first embodiment (comparative example) of a controller.

FIG. 2 is a diagram showing a first embodiment of the controller 12 (corresponding to a comparative example that is compared to a second embodiment (FIG. 6) described below). The controller 12 according to this embodiment includes a D flip-flop 120.

The D flip-flop 120 accepts input of the set signal SET via its clock end (>). The D flip-flop 120 accepts input of a fixed voltage (such as high-level voltage Vdd) via its data end (D). The D flip-flop 120 accepts input of the reset signal RST via its reset end (R). The D flip-flop 120 outputs a duty control signal S0 from its output end (Q).

In other words, the D flip-flop 120 switches a logic level of the duty control signal S0 in response to the set signal SET and the reset signal RST. For example, the D flip-flop 120 latches and outputs the fixed voltage at the data end (D) at a timing when the set signal SET drops. As a result, the duty control signal S0 is set to the high level (=Vdd). In addition, for example, the D flip-flop 120 resets the duty control signal S0 to low level at a timing when the reset signal RST drops.

Note that, the duty control signal S0 determines an ON duty Don of the output device 1 (a percentage of the ON period Ton in a switching cycle Tsw, that is, Don=Ton/Tsw). The above-described gate control signals S1 and S2 are basically generated from the duty control signal S0.

In addition, as described above, the controller 12 has, for example, the OFF-skip function to skip the cyclic OFF transitions of the output device 1 under the state in which the difference between the input voltage Vi and the output voltage Vo is small. In the following, this OFF-skip function is described.

<OFF-Skip Function (First Embodiment)>

In the power-supply control apparatus 100, the N-channel MOSFET is used as the output device 1. Thus, in order that the output device 1 is reliably turned ON, the gate drive signal G1 that is higher than the input voltage Vi (switch voltage Vsw at the high level) needs to be applied to the gate of the output device 1. In view of such circumstances, in the power-supply control apparatus 100, the boot-strap circuit BST is employed as means for generating the drive voltage for the driver 13.

Note that, the boot-strap circuit BST needs a charging period for the capacitor C2. In other words, in order that the boost voltage Vb that is higher than the switch voltage Vsw is generated, the OFF period Toff (=Tsw-Ton) during which the output device 1 is turned OFF and the rectifying device 2 is turned ON is essential.

In view of such circumstances, in the power-supply control apparatus 100, a minimum OFF period Toff_min (that is, a minimum value of the OFF period Toff) is set so that operation to charge the capacitor C2 is not disturbed. In other words, in the power-supply control apparatus 100, a maximum ON period Ton_max (that is, a maximum value of the ON period Ton) is limited.

In this way, in the power-supply control apparatus 100 employing the boot-strap circuit BST, the ON duty Don of the output device 1 cannot be set to 1 (=100%). Thus, for example, there is a risk that, under the state in which the difference between the input voltage Vi and the output voltage Vo is small, the output voltage Vo does not reach a target value because the minimum OFF period Toff_min is secured (that is, the maximum ON period Ton_max is limited).

As a precaution to suppress such an output decrease, the controller 12 has the OFF-skip function.

Figure 3:
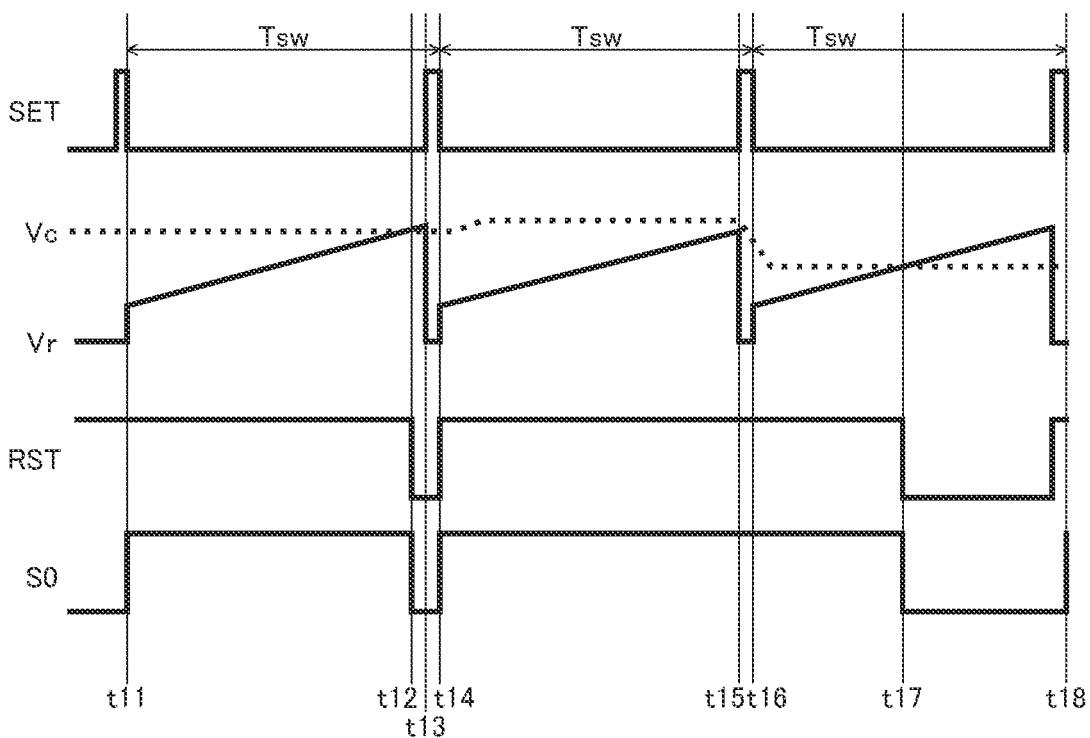
FIG. 3 is a chart showing an OFF-skip function according to the first embodiment.

FIG. 3 is a chart showing the OFF-skip function according to the first embodiment. In FIG. 3, the set signal SET, the control signal Vc (a dotted line), the ramp signal Vr (a solid line), the reset signal RST, and the duty control signal S0 are represented sequentially from above.

At a time point t11, the set signal SET drops to low level. In response thereto, the duty control signal S0 is set to the high level. As a result, the output device 1 is turned ON, and the rectifying device 2 is turned OFF. In addition, in response to the drop of the set signal SET to the low level, the ramp signal Vr starts to rise with a predetermined slope.

At a time point t12 in a period from the time point t11 when the set signal SET drops to the low level to a time point t13 when the set signal SET rises to high level, the control signal Vc and the ramp signal Vr intersect with each other. At this time, the reset signal RST drops to low level, and hence the duty control signal S0 is reset to the low level. As a result, the output device 1 is turned OFF, and the rectifying device 2 is turned ON.

At the time point t13, in response to the rise of the set signal SET to the high level, the ramp signal Vr is reset to its default value (for example, to 0 V).

At a time point t14, the set signal SET drops to the low level. In response thereto, the duty control signal S0 is set to the high level again. As a result, the output device 1 is turned ON, and the rectifying device 2 is turned OFF. In addition, at the time point t14, in response to the drop of the set signal SET to the low level, the ramp signal Vr starts to rise with the predetermined slope again.

Note that, a period from a timing at which the set signal SET drops in a certain cycle to a timing at which the set signal SET drops in a subsequent cycle (that is, from the time points t11 to t14) corresponds to the switching cycle Tsw. A high-level period of the duty control signal S0 corresponds to the ON period Ton. A low-level period of the duty control signal S0 corresponds to the OFF period Toff ($=Tsw-Ton$).

In this way, under a state in which the OFF-skip function is not implemented, the controller 12 turns ON the output device 1 in response to the set signal SET, and turns OFF the output device 1 in response to the reset signal RST. Thus, the ON duty Don is subjected to PWM [Pulse Width Modulation] control so as to become larger as the control signal Vc becomes higher.

Next, if the control signal Vc rises, for example, in response to drop of the input voltage Vi as in a period from the time point t14 when the set signal SET drops to the low level to a time point t15 when the set signal SET rises to the high level, there can be a situation in which the control signal Vc and the ramp signal Vr do not intersect with each other.

In such a situation, the reset signal RST does not drop to the low level. Thus, at the time point t15, the ramp signal Vr is reset to the default value (for example, to 0 V) with the duty control signal S0 remaining not reset to the low level. As a result, the OFF period Toff that is supposed to cyclically appear (that is, a low-level period of the duty control signal S0) is skipped. In other words, the cyclic OFF transition of the output device 1 is skipped.

By such OFF-skip control, the set signal SET is apparently divided by "n." Thus, the switching cycle Tsw is extended to $n \times Tsw$ (n=2 as in a period from the time point t14 to a time point t18 in FIG. 3). In other words, the ON period Ton of the output device 1 is extended to be longer than the above-described maximum ON period Ton_max. As a result, the ON duty Don of the output device 1 is simulatively pulled up to 100%. Thus, the load response characteristics and power-supply response characteristics of the switched-mode power supply A are increased.

For example, if the switched-mode power supply A is directly connected as a primary power supply to an in-vehicle battery, the input voltage Vi (that is, battery voltage) can drop at a time of cranking (that is, at a time of starting an engine). Even in such a situation, by the above-described OFF-skip control, unexpected drop of the output voltage Vo can be suppressed to the minimum.

Note that, in the OFF-skip control according to the first embodiment, as at a time point t17, even under a state in which the above-described OFF-skip control is performed, in response to the drop of the reset signal RST to the low level, the duty control signal S0 is caused to drop to the low level without a delay. In other words, irrespective of whether or not the function to divide the switching frequency Fsw is implemented, the reset signal RST is an only condition to cause the transition from the ON period Ton to the OFF period Toff.

Figure 4:
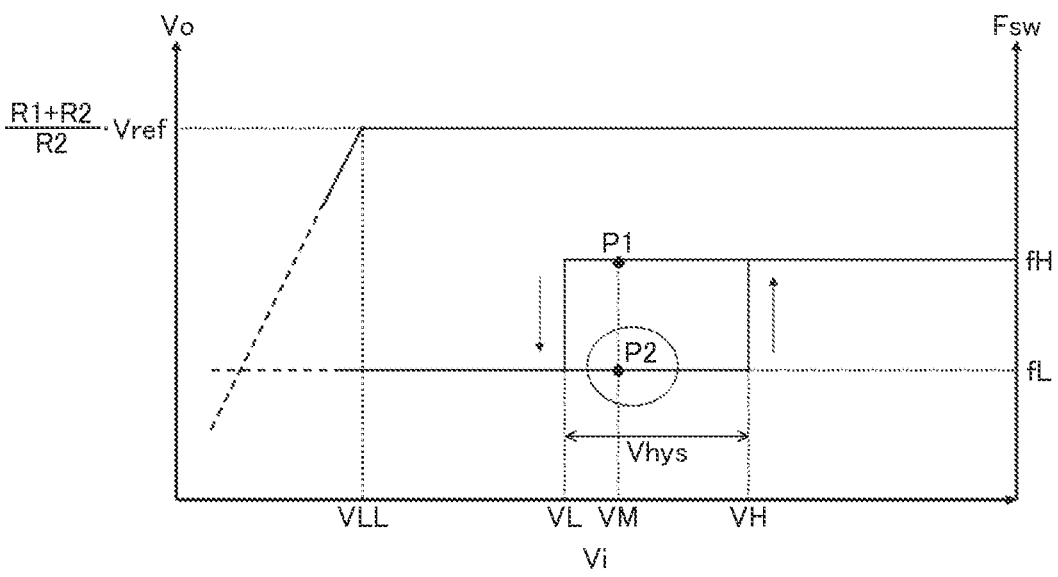
FIG. 4 is a graph showing hysteresis characteristics of a switching frequency.

FIG. 4 is a graph showing hysteresis characteristics of the switching frequency Fsw. In FIG. 4, the abscissa axis represents the input voltage Vi, the ordinate axis (on the left) represents the output voltage Vo, and the ordinate axis (on the right) represents the switching frequency Fsw.

Under a state in which the input voltage Vi is higher than a lowest input voltage VLL, the output voltage Vo is maintained at a desired target value ($=\{(R1+R2)/R2\} \times Vref$).

In addition, as represented by the abscissa axis in FIG. 4, there is hysteresis Vhys ($=VH-VL$) between a start threshold VL and a cancellation threshold VH for switching ON/OFF of the OFF-skip function (that is, function to divide the switching frequency Fsw).

For example, under a state in which the switching frequency Fsw has been set to a first frequency fH (for example, to 440 kHz), in response to the input voltage Vi that has dropped to be lower than the start threshold VL (for example, than 9.91 V), the OFF-skip function is implemented. As a result, the switching frequency Fsw is pulled down from the first frequency fH to a second frequency fL (for example, to 220 kHz).

Meanwhile, under a state in which the switching frequency Fsw has been set to the second frequency fL, in response to the input voltage Vi that has risen to be higher than the cancellation threshold VH (for example, than 12.45 V), the OFF-skip function is stopped. As a result, the switching frequency Fsw is pulled up from the second frequency fL to the first frequency fH.

Thus, under a state in which the input voltage Vi has an intermediate value VM (note that, VL<VM<VH, specifically, VM=10 V), as indicated by points P1 and P2 in FIG. 4, the switching frequency Fsw can be either one of the first frequency fH and the second frequency fL. In other words, under the state in which the input voltage Vi has the intermediate value VM, the function to divide the switching frequency Fsw (that is, OFF-skip function) may be implemented or may not be implemented. In still other words, under the state in which the input voltage Vi has the intermediate value VM, operation cannot be performed with the switching frequency Fsw fixed.

Figure 5:
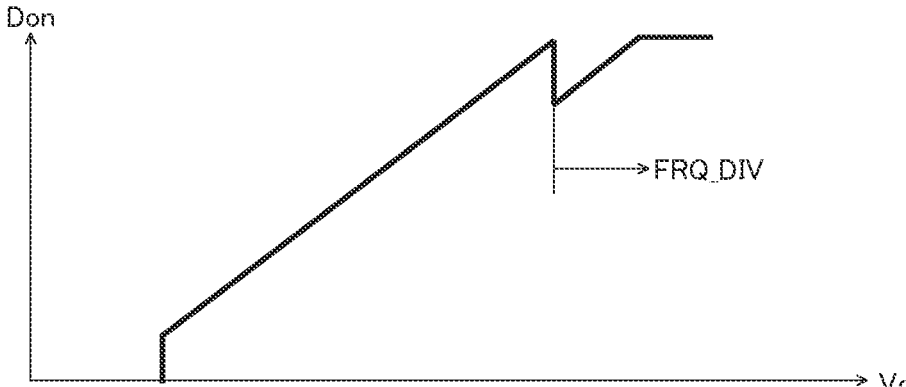
FIG. 5 is a graph showing a relationship between a control signal and an ON duty according to the first embodiment.

FIG. 5 is a graph showing a relationship between the control signal Vc and the ON duty Don according to the first embodiment. In FIG. 5, the abscissa axis represents the control signal Vc, and the ordinate axis represents the ON duty Don. As shown in FIG. 5, by the OFF-skip control according to the first embodiment, the ON duty Don does not monotonically increase relative to the control signal Vc, which can cause a system to be unstable. In the following, causes of such a problem are investigated in detail.

Figure 6:
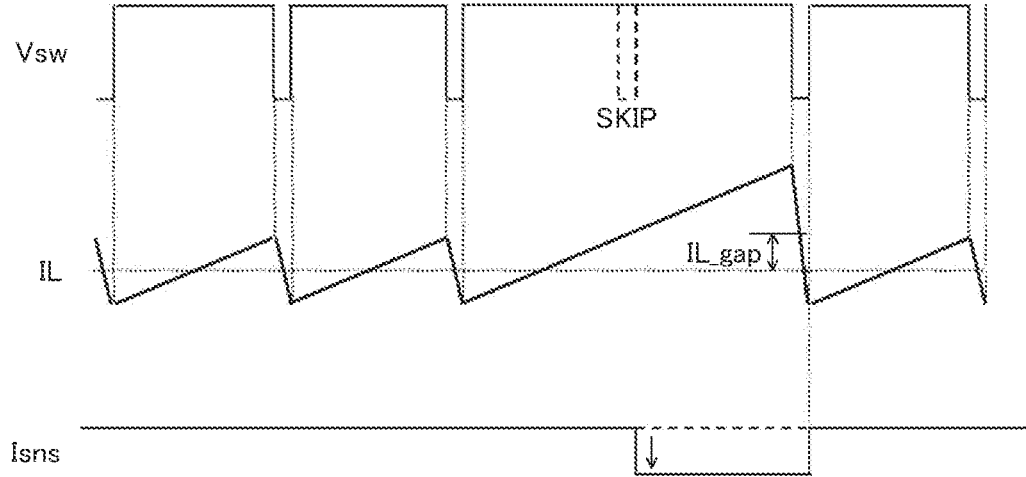
FIG. 6 is a chart showing how a frequency-division operation causes a gap between an actual value and a sample value of an inductor current.

FIG. 6 is a chart showing how the frequency-division operation (that is, OFF-skip control) causes a gap between an actual value and a sample value of an inductor current IL. In FIG. 6, the switch voltage Vsw, the inductor current IL, and the current-detecting signal Isns are represented sequentially from above.

In an ON period of the rectifying device 2, specifically, only at a midpoint of the ON period, the power-supply control apparatus 100 samples the inductor current IL (specifically, lower inductor current IL2). Thus, when the ON period of the rectifying device 2 is skipped by the frequency-division operation, electric-current information cannot be acquired (the current-detecting signal Isns cannot be generated). As a result, a gap IL_gap can occur between the actual value (a solid line) and the sample value (a dashed line) of the inductor current IL. Thus, in order that operation of a feedback control loop is stably performed, the gap IL_gap needs to be corrected by pulling down the current-detecting signal Isns at the time of the frequency-division operation (that is, at the time of the OFF skip).

Figure 7:
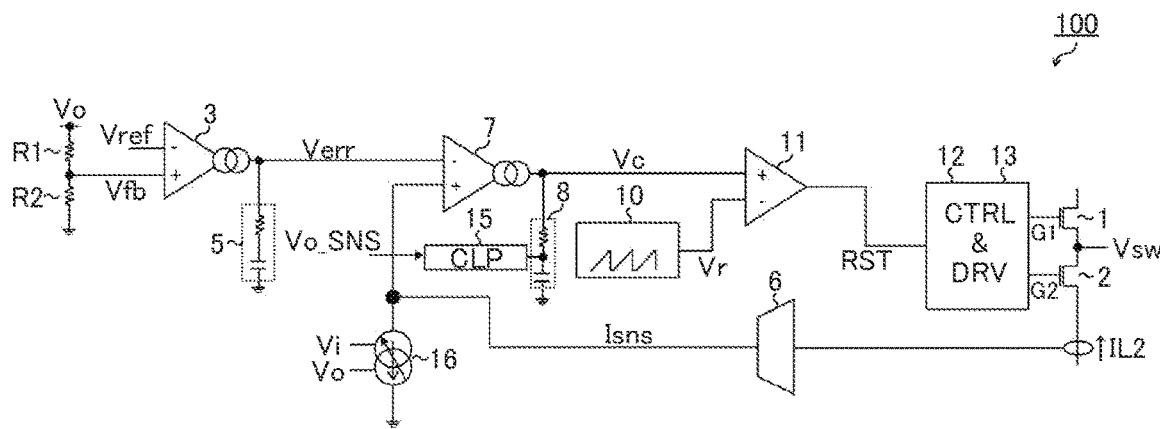
FIG. 7 is a diagram showing an example of introducing a pseudo-current generating circuit.

FIG. 7 is a diagram showing an example of introducing a pseudo-current generating circuit. As shown in FIG. 7, in addition to the above-described components 1 to 14 (refer to FIG. 1), a clamper 15 and a pseudo-current generating circuit 16 can be introduced into the power-supply control apparatus 100.

The clamper 15 clamps the control signal Vc to be equal to or less than a predetermined upper-limit value. As shown in FIG. 7, the clamper 15 may be connected, for example, to the phase compensation circuit 8 (in FIG. 7, to a connection node between a phase compensation resistor and a phase compensation capacitor). The clamper 15 may accept input of a voltage detection signal Vo_SNS in response to the output voltage Vo.

The pseudo-current generating circuit 16 corrects the above-described gap IL_gap by pulling down the current-detecting signal Isns at the time of the frequency-division operation (that is, at the time of the OFF skip). Note that, pulling down the current-detecting signal Isns is exactly the same as pulling down the control signal Vc. The pseudo-current generating circuit 16 may accept input of the input voltage Vi and the output voltage Vo.

Figure 8:
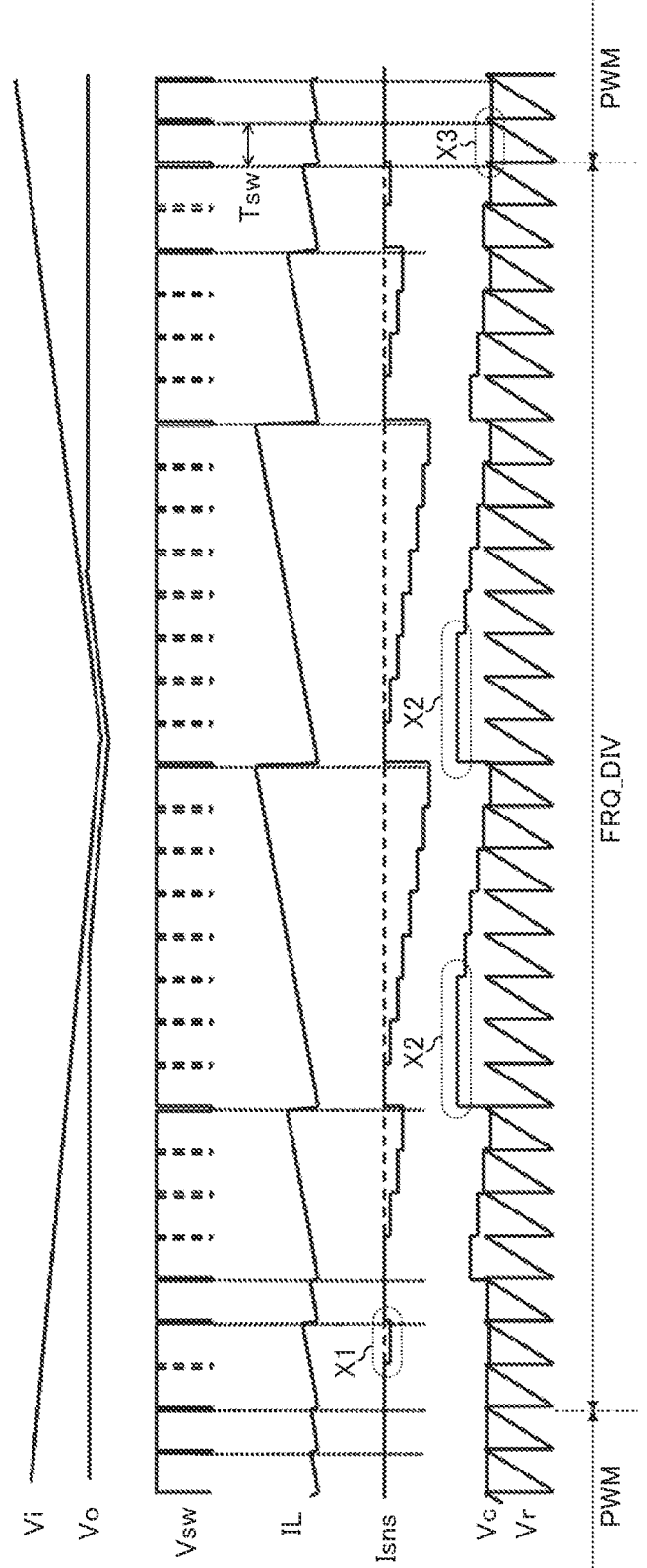
FIG. 8 is an explanatory chart showing a difference between the frequency-division operation and PWM operation.

FIG. 8 is an explanatory chart showing a difference between the frequency-division operation and PWM operation. In FIG. 8, the input voltage Vi, the output voltage Vo, the switch voltage Vsw, the inductor current IL, the current-detecting signal Isns, the control signal Vc, and the ramp signal Vr are represented sequentially from above.

As shown in FIG. 8, in the power-supply control apparatus 100, depending on whether or not the control signal Vc and the ramp signal Vr intersect with each other within one switching cycle Tsw, the PWM operation (represented by "PWM" in FIG. 8) and the frequency-division operation (represented by "FRQ_DIV" in FIG. 8) are switched to each other.

In particular, as indicated by a dotted circle X1 in FIG. 8, during the frequency-division operation, the current-detecting signal Isns including the electric-current information is pulled down in a stepwise manner. As a result, the control signal Vc and the output voltage ramp signal Vr intersect with each other. By such an electric-current-information correction process, the gap IL_gap (FIG. 6) between the actual value and the sample value of the inductor current IL is corrected. Thus, stability of the feedback control loop is increased.

Note that, as indicated by dotted circles X2 in FIG. 8, the control signal Vc is limited to be equal to or less than the predetermined upper-limit value by the operation of the clamper 15.

In addition, as indicated by a dotted circle X3 in FIG. 8, in response to the intersection of the control signal Vc and the ramp signal Vr within one switching cycle Tsw, a pulse of the reset signal RST (not shown in FIG. 8) is generated. As a result, the frequency-division operation is cancelled, and the PWM operation is restarted.

Figure 9:
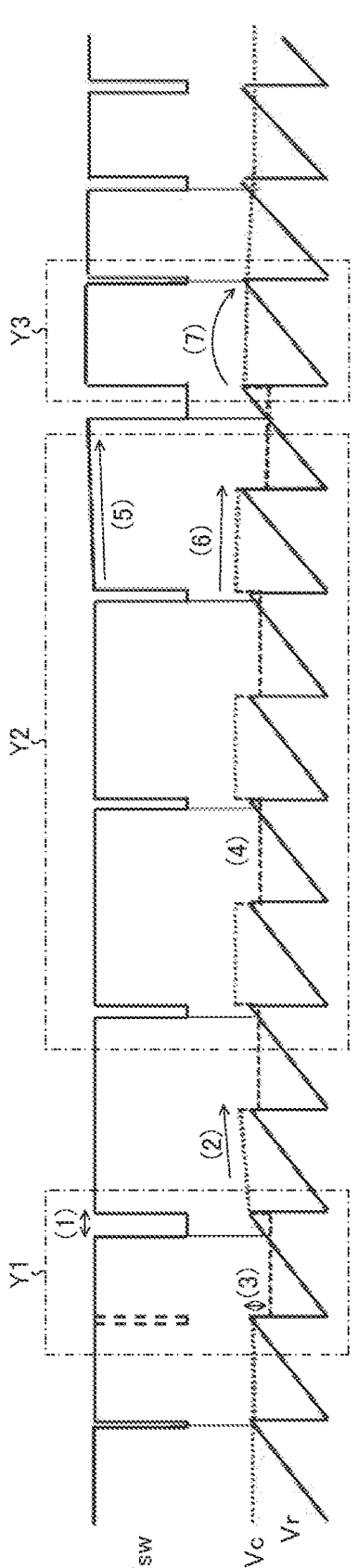
FIG. 9 is a chart showing a factor of hysteresis between a start threshold and a cancellation threshold of the frequency-division operation.

FIG. 9 is a chart showing a factor of the hysteresis between the start threshold and the cancellation threshold of the frequency-division operation. In FIG. 9, the switch voltage Vsw, the control signal Vc (dotted lines and dashed lines), and the ramp signal Vr (a solid line) are represented sequentially from above.

Note that, the dotted lines of the control signal Vc represent a state in which the electric-current-information correction process by the pseudo-current generating circuit 16 has not been executed. In the following, the control signal Vc in this state may be referred to as an "uncorrected control signal Vc (dotted lines)."

Meanwhile, the dashed lines of the control signal Vc represent a state in which the electric-current-information correction process by the pseudo-current generating circuit 16 has been executed. In the following, the control signal Vc in this state may be referred to as a "corrected control signal Vc (dashed lines)."

The frequency-division operation is started in a part Y1 surrounded by dash-dotted lines in FIG. 9. If a width of an OFF pulse (refer to (1) in FIG. 9) that is generated immediately after the start of the frequency-division operation is large, feedback is performed to raise the uncorrected control signal Vc in a subsequent cycle (refer to (2) in FIG. 9). As a result, the ON duty Don decreases, and hence the monotonical increase of the ON duty Don can be impaired. Note that, the width of the OFF pulse during the frequency-division operation depends on an amount of the correction of the control signal Vc by the pseudo-current generating circuit 16 (refer to (3) in FIG. 9), which is described in detail below.

In a part Y2 surrounded by dash-dotted lines in FIG. 9, the above-described frequency-division operation is continued to subject the switching frequency Fsw to a half frequency division. In other words, by the above-described OFF-skip control, the switching cycle Tsw is apparently extended to be twice.

Note that, a condition that a return from the frequency-division operation to the PWM operation is made is satisfied in response to the intersection of the control signal Vc and the ramp signal Vr and the generation of the pulse of the reset signal RST within one switching cycle Tsw as described above. Note that, the uncorrected control signal Vc (dotted lines) has risen to a level higher than a maximum value of the ramp signal Vr. Thus, the frequency-division operation is continued with the pulse of the reset signal RST remaining not generated. As in the part Y2 surrounded by the dash-dotted lines in FIG. 9, apparently, the PWM operation is performed in response to the corrected control signal Vc (dashed lines).

In response to the rise of the input voltage Vi, the feedback is performed to reduce the uncorrected control signal Vc (dotted line) (refer to (5) and (6) in FIG. 9). Note that, until the uncorrected control signal Vc (dotted lines) and the ramp signal Vr intersect with each other to generate the pulse of the reset signal RST within one switching cycle Tsw, the above-described frequency-division operation is continued. Thus, the hysteresis occurs between the start threshold and the cancellation threshold of the frequency-division operation.

In a part Y3 surrounded by the dash-dotted lines in FIG. 9, the uncorrected control signal Vc (dotted lines) intersects with the ramp signal Vr within one switching cycle Tsw (refer to (7) in FIG. 9). Thus, the frequency-division operation is cancelled, and the PWM operation is restarted.

Figure 10:
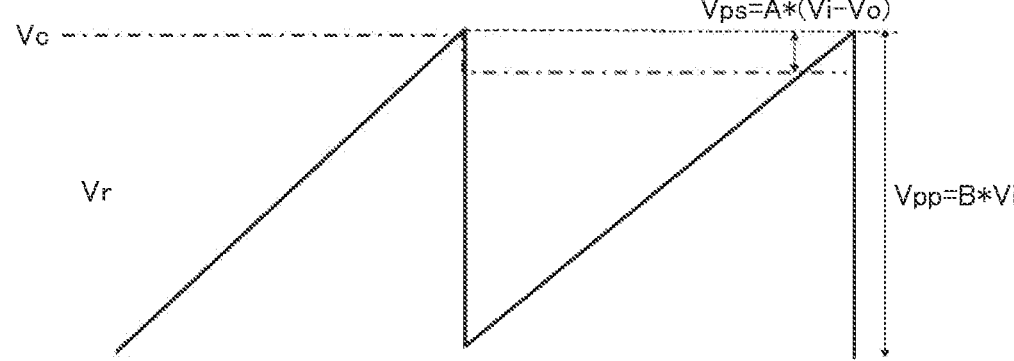
FIG. 10 is an explanatory chart showing a condition that the hysteresis occurs and whether or not the hysteresis has occurred.

FIG. 10 is an explanatory chart showing a condition that the hysteresis occurs and whether or not the hysteresis has occurred. In FIG. 10, a solid line represents the ramp signal Vr, and a dash-dotted line represents the control signal Vc.

An amount Vps of the correction of the control signal Vc by the pseudo-current generating circuit 16 is proportionate to a difference value (Vi–Vo) between the input voltage Vi and the output voltage Vo. In other words, the amount Vps of the correction can be expressed as Vps=A×(Vi–Vo) (where A is a proportionality coefficient).

In addition, an amplitude Vpp of the ramp signal Vr is proportionate to the input voltage Vi. In other words, the amplitude Vpp can be expressed as Vpp=B×Vi (where B is a proportionality coefficient).

In this context, the condition that the hysteresis occurs between the start threshold and the cancellation threshold of the frequency-division operation is A>B. In the following, this conditional expression is described in detail.

Figure 11:
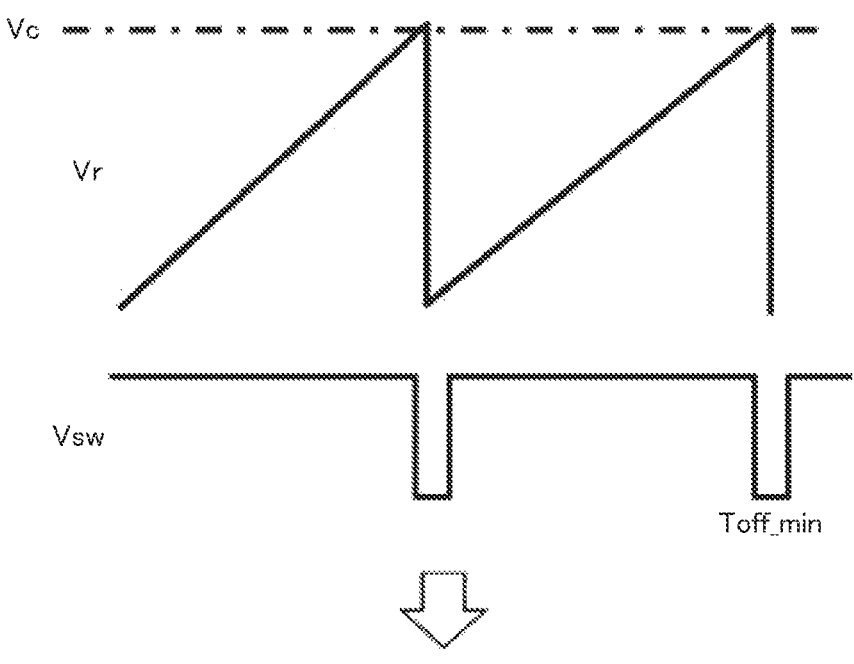
FIG. 11 is a chart showing timings before and after start of the frequency-division operation.
Figure 11:
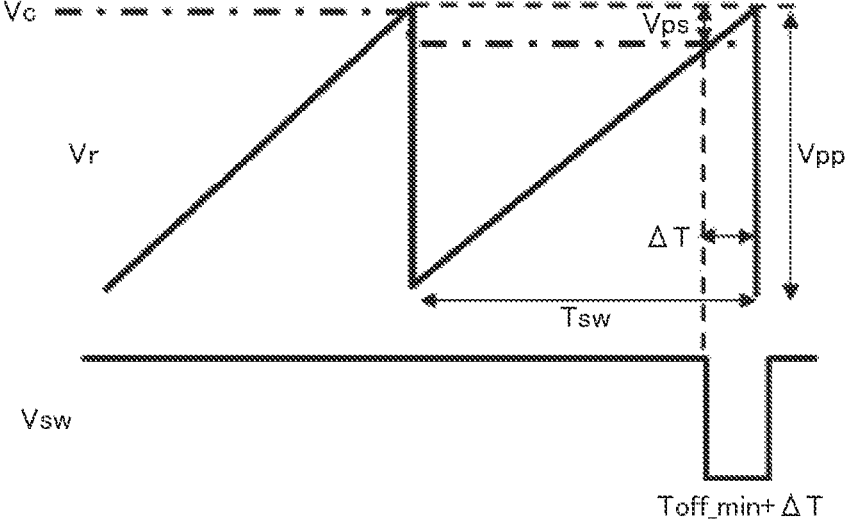

FIG. 11 is a chart showing timings before and after the start of the frequency-division operation. On an upper side of FIG. 11, the control signal Vc (a dash-dotted line), the ramp signal Vr (a solid line), and the switch voltage Vsw immediately before the start of the frequency-division operation are represented. Meanwhile, on a lower side of FIG. 11, the control signal Vc (dash-dotted lines and a dotted line), the ramp signal Vr (a solid line), and the switch voltage Vsw immediately after the start of the frequency-division operation are represented. Note that, the dotted line of the control signal Vc represents a level of an uncorrected signal.

A width of the OFF pulse immediately after the start of the frequency-division operation is larger than a width of the OFF pulse immediately before the start of the frequency-division operation by an increment $\Delta T$ that depends on the amount Vps of the correction of the control signal Vc. In other words, the width of the OFF pulse immediately after the start of the frequency-division operation can be expressed as Toff_min+$\Delta T$, where Toff_min is the width of the OFF pulse immediately before the start of the frequency-division operation.

Under a state in which an ON duty immediately after the start of the frequency-division operation is smaller than an ON duty immediately before the start of the frequency-division operation, the control signal Vc rises. As a result, the hysteresis occurs between the start threshold and the cancellation threshold of the frequency-division operation, which can be represented by the following conditional expression (1).

[Math 1]

$$\frac{2 \times Tsw - (Toff\_min + \Delta T)}{2 \times Tsw} < Don \tag{1}$$

In this context, the width Toff_min of the OFF pulse immediately before the start of the frequency-division operation is (1–Don)×Tsw. Thus, the expression (1) can be transformed into the following expression (2).

[Math 2]

$$\frac{2 \times Tsw - \{(1 - Don) \times Tsw + \Delta T\}}{2 \times Tsw} < Don \tag{2}$$

In addition, the increment $\Delta T$ can be represented by the following expression (3), where A×(Vi–Vo) is the amount Vps of the correction of the control signal Vc, and where B×Vi is the amplitude Vpp of the ramp signal Vr.

[Math 3]

$$\Delta T = Tsw \times \frac{Vps}{Vpp} = Tsw \times \frac{A \times (Vi - Vo)}{B \times Vi} = Tsw \times \frac{A}{B} \times (1 - Don) \tag{3}$$

Thus, by substituting the expression (3) into the expression (2) and then arranging a resultant equation, the condition A>B that the hysteresis occurs between the start threshold and the cancellation threshold of the frequency-division operation is obtained.

In the following, with regard to the above-described investigation, a second embodiment that enables more appropriate OFF-skip control is proposed.
<Controller (Second Embodiment)>

Figure 12:
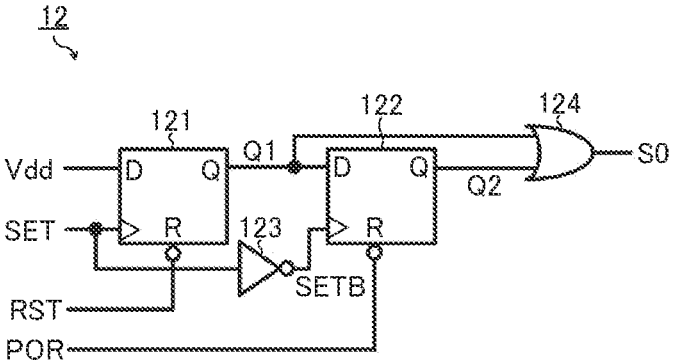
FIG. 12 is a diagram showing a second embodiment of the controller.

FIG. 12 is a diagram showing a second embodiment of the controller 12. The controller 12 according to this embodiment includes D flip-flops 121 and 122, an inverter 123, and an OR gate 124.

The D flip-flop 121 (corresponding to a first D flip-flop) accepts input of the set signal SET via its clock end (>). The D flip-flop 121 accepts input of a fixed voltage (such as the high-level voltage Vdd) via its data end (D). The D flip-flop 121 accepts input of the reset signal RST via its reset end (R). The D flip-flop 121 outputs an output signal Q1 (corresponding to a first output signal) from its output end (Q).

In other words, the D flip-flop 121 switches a logic level of the output signal Q1 in response to the set signal SET and the reset signal RST. For example, the D flip-flop 121 latches and outputs the fixed voltage at the data end (D) at a timing when the set signal SET rises (for example, at a timing opposite to that in the above-described D flip-flop 120). As a result, the output signal Q1 is set to the high level (=Vdd). In addition, for example, the D flip-flop 121 resets the output signal Q1 to low level at a timing when the reset signal RST drops (for example, at the same timing as that in the above-described D flip-flop 120).

The D flip-flop 122 (corresponding to a second D flip-flop) accepts input of an inversion set signal SETB via its clock end (>). The D flip-flop 122 accepts input of the output signal Q1 via its data end (D). The D flip-flop 122 accepts input of a power-ON reset signal POR via its reset end (R). The D flip-flop 122 outputs an output signal Q2 (corresponding to a second output signal) from its output end (Q).

In other words, the D flip-flop 122 switches a logic level of the output signal Q2 in response to the inversion set signal SETB and the power-ON reset signal POR. For example, the D flip-flop 122 latches and outputs the fixed voltage at the data end (D) at a timing when the inversion set signal SETB rises (that is, at the timing when the set signal SET drops). As a result, the output signal Q2 is set to the logic level of the output signal Q1. In addition, the D flip-flop 122 resets the output signal Q2 to low level, for example, at a timing when the power-ON reset signal POR drops. Note that, the power-ON reset signal POR may be caused to drop to low level, for example, at the time when the power-supply control apparatus 100 is activated.

The inverter 123 generates the inversion set signal SETB by inverting a logic level of the set signal SET. Thus, the inversion set signal SETB is at low level under a state in which the set signal SET is at the high level. Conversely, the inversion set signal SETB is at high level under a state in which the set signal SET is at the low level.

The OR gate 124 generates the duty control signal S0 by calculating a logical sum of the output signals Q1 and Q2. Thus, the duty control signal S0 is at the high level under a state in which an at least one of the output signals Q1 and Q2 is at the high level. Conversely, the duty control signal S0 is at the low level under a state in which both the output signals Q1 and Q2 are at the low levels.

Note that, as described above, the duty control signal S0 determines the ON duty Don of the output device 1. In other words, the above-described gate control signals S1 and S2 are basically generated from the duty control signal S0.

<OFF-Skip Function (Second Embodiment)>

Figure 13:
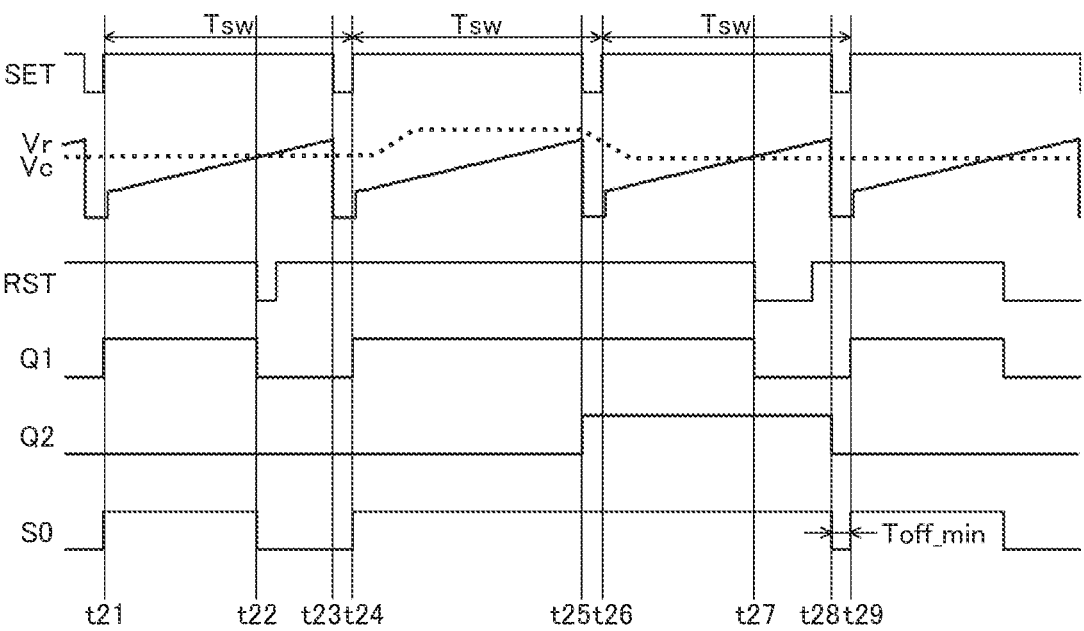
FIG. 13 is a chart showing the OFF-skip function according to the second embodiment.

FIG. 13 is a chart showing the OFF-skip function according to the second embodiment. In FIG. 13, the set signal SET, the control signal Vc (a dotted line), the ramp signal Vr (a solid line), the reset signal RST, the output signals Q1 and Q2, and the duty control signal S0 are represented sequentially from above.

At a time point t21, the set signal SET rises to the high level. In response thereto, the output signal Q1 is set to the high level. Thus, the duty control signal S0 is at the high level. As a result, the output device 1 is turned ON, and the rectifying device 2 is turned OFF. In addition, in response to the rise of the set signal SET to the high level, the ramp signal Vr starts to rise with a predetermined slope.

At a time point t22 in a period from the time point t21 when the set signal SET rises to the high level and a time point t23 when the set signal SET drops to the low level, the control signal Vc and the ramp signal Vr intersect with each other. At this time, the reset signal RST drops to the low level, and hence the output signal Q1 is reset to the low level. Thus, the duty control signal S0 is at the low level. As a result, the output device 1 is turned OFF, and the rectifying device 2 is turned ON.

At the time point t23, in response to the drop of the set signal SET to the low level, the ramp signal Vr is reset to its default value (for example, to 0 V). In addition, in response to the drop of the set signal SET to the low level, the inversion set signal SETB (not shown) rises to the high level. Thus, the output signal Q2 is latched to the logic level (low level at this time) of the output signal Q1.

At a time point t24, the set signal SET rises to the high level. In response thereto, the output signal Q1 is set to the high level again. Thus, the duty control signal S0 rises to the high level again. As a result, the output device 1 is turned ON, and the rectifying device 2 is turned OFF. In addition, at the time point t24, in response to the rise of the set signal SET to the high level, the ramp signal Vr starts to rise with the predetermined slope again.

Note that, a period from a timing at which the set signal SET rises in a certain cycle to a timing at which the set signal SET rises in a subsequent cycle (that is, from the time points t21 to t24) corresponds to the switching cycle Tsw. The high-level period of the duty control signal S0 corresponds to the ON period Ton. The low-level period of the duty control signal S0 corresponds to the OFF period Toff (=Tsw−Ton).

In this way, under the state in which the OFF-skip function is not implemented, the controller 12 turns ON the output device 1 in response to the set signal SET, and turns OFF the output device 1 in response to the reset signal RST. Thus, the ON duty Don is subjected to the PWM control so as to become larger as the control signal Vc becomes higher. The operation is basically the same until the time point t24 as that described above in the first embodiment (refer to the time points t11 to t14 in FIG. 3).

Next, if the control signal Vc rises, for example, in response to the drop of the input voltage Vi as in a period from the time point t24 when the set signal SET rises to the high level to a time point t25 when the set signal SET drops to the low level, the situation in which the control signal Vc and the ramp signal Vr do not intersect with each other can occur.

In such a situation, the reset signal RST does not drop to the low level, and hence, at the time point t25, the output signal Q1 is not reset to the low level. Thus, the ramp signal Vr is reset to the default value (for example, to 0 V) with the duty control signal S0 not dropping to the low level. As a result, the OFF period Toff that is supposed to cyclically appear (that is, the low-level period of the duty control signal S0) is skipped. In other words, the cyclic OFF transition of the output device 1 is skipped. By this OFF-skip control, the load response characteristics and the power-supply response characteristics of the switched-mode power supply A are increased as described above.

Note that, at the time point t25, in response to the drop of the set signal SET to the low level, the inversion set signal SETB (not shown) rises to the high level. Thus, the output signal Q2 is latched to the logic level (high level at this time) of the output signal Q1. In this way, the output signal Q2 is at the high level under the state in which the OFF-skip control is performed. In other words, the output signal Q2 can be regarded as a flag signal that indicates whether or not the OFF-skip control is being performed.

At a time point t26, the set signal SET rises to the high level. In response thereto, the output signal Q1 is kept to the high level. Thus, the duty control signal S0 is kept to the high level. As a result, the output device 1 is turned ON, and the rectifying device 2 is turned OFF. In addition, at the time point t26, in response to the rise of the set signal SET to the high level, the ramp signal Vr starts to rise with the predetermined slope again.

In this context, if the control signal Vc drops, for example, in response to the rise of the input voltage Vi, as at a time point t27 in a period from the time point t26 when the set signal SET rises to the high level to a time point t28 when the set signal SET drops to the low level, a situation in which the control signal Vc and the ramp signal Vr intersect with each other can occur. At this time point, the reset signal RST drops to the low level, and hence the output signal Q1 is reset to the low level.

Meanwhile, until the set signal SET drops to the low level, that is, until the inversion set signal SETB (not shown) rises to the high level, the output signal Q2 is maintained at the same logic level as that until then (high level at this time). Thus, despite the drop of the reset signal RST to the low level, the duty control signal S0 is maintained at the high level. As a result, the output device 1 remains turned ON, and the rectifying device 2 remains turned OFF.

In this way, under the state in which the OFF-skip function is implemented, the controller 12 ignores the reset signal RST, and keeps the output device 1 turned ON. In other words, the state in which the OFF-skip function is not implemented, that is, the state in which the output signal Q2 is at the low level is added as the condition to cause the transition from the ON period Ton to the OFF period Toff.

According to this configuration, despite the drop of the reset signal RST to the low level under the state in which the OFF-skip function is implemented, an immediate transition from the ON period Ton to the OFF period Toff does not occur. In other words, the width of the OFF pulse that is generated immediately after the start of the frequency-division operation does not increase. Thus, the monotonical increase of the ON duty Don can be maintained.

At the time point t28, in response to the drop of the set signal SET to the low level, the ramp signal Vr is reset to its default value (for example, to 0 V). In addition, at the time point t28, in response to the drop of the set signal SET to the low level, the inversion set signal SETB (not shown) rises to the high level. Thus, the output signal Q2 is latched to the logic level (low level at this time) of the output signal Q1. As a result, the duty control signal S0 drops to the low level, and hence the output device 1 is turned OFF, and the rectifying device 2 is turned ON.

At a time point t29, the set signal SET rises to the high level. In response thereto, the output signal Q1 is set to the high level again. Thus, the duty control signal S0 rises to the high level again. As a result, the output device 1 is turned ON, and the rectifying device 2 is turned OFF.

In other words, a period from the drop of the set signal SET to the low level to the rise of the high level (that is, from the time points t28 to t29) can be regarded as the above-described minimum OFF period Toff_min. In this way, at the time of turning OFF the output device 1, the controller 12 keeps the output device 1 turned OFF at least over the minimum OFF period Toff_min. Thus, the operation of the boot-strap circuit BST is prevented from being hindered.

Figure 14:
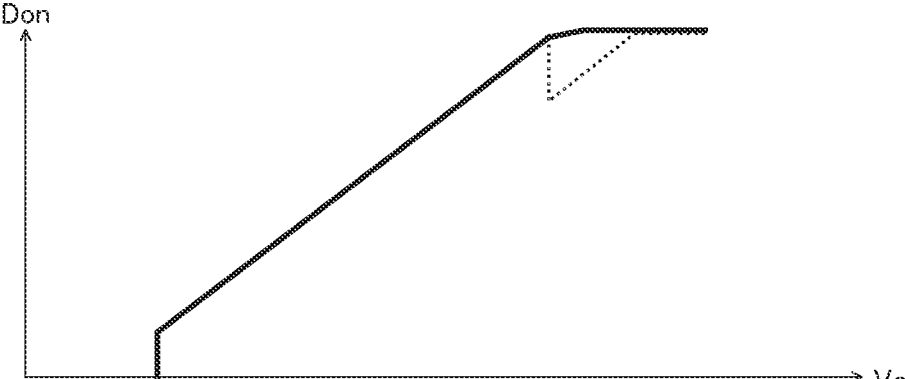
FIG. 14 is a graph showing a relationship between a control signal and an ON duty according to the second embodiment.

FIG. 14 is a graph showing a relationship between the control signal Vc and the ON duty Don according to the second embodiment. As in FIG. 5 referred to above, the abscissa axis represents the control signal Vc, and the ordinate axis represents the ON duty Don. As shown in FIG. 14, in the OFF-skip control according to the second embodiment, the ON duty Don monotonically increases relative to the control signal Vc. Thus, the system is more stabilized than in the first embodiment.

<Application to Vehicle>

Figure 15:
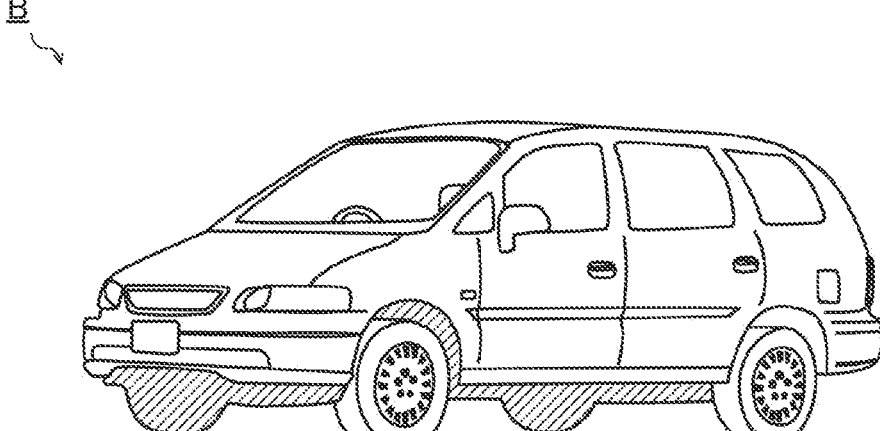
FIG. 15 is an exterior view of a vehicle.

FIG. 15 is an exterior view of a vehicle. Various electronic apparatuses to be powered by a battery are installed in this vehicle B according to a configuration example of the present disclosure.

The vehicle B encompasses not only internal-combustion-engine vehicles but also electric vehicles (such as BEVs [Battery Electric Vehicles], HEVs [Hybrid Electric Vehicles], and PHEVs/PHVs (Plug-in Hybrid Electric Vehicles/Plug-in Hybrid Vehicles], and other xEVs such as FCEVs/FCVs (Fuel Cell Electric Vehicles/Fuel Cell Vehicles]).

Note that, the switched-mode power supply A described hereinabove can be incorporated into all the electronic apparatuses to be installed in the vehicle B. In that case, the switched-mode power supply A may be a primary power supply. In other words, the battery may directly supply the input voltage Vi to the switched-mode power supply A.

APPENDICES

The power-supply control apparatus according to the present disclosure enables appropriate OFF-skip control. The various embodiments described hereinabove are summarized as follows.

[Appendix 1] A power-supply control apparatus (100), including a controller (12) that is configured to perform duty control on a switch device (1) which forms an output stage (HB) of a switched-mode power supply (A) which is configured to generate an output voltage (Vo) from an input voltage (Vi), in which the controller (12)

has an OFF-skip function to skip cyclic OFF transitions of the switch device (1), and keeps the switch device (1) turned ON by ignoring a reset signal (RST) based on feedback control on the output voltage (Vo) under a state in which the OFF-skip function is implemented.

[Appendix 2] The power-supply control apparatus (100) according to Appendix 1, further including:

a first amplifier (3) that is configured to generate an error signal (Verr) in accordance with a difference between a feedback voltage (Vfb) in accordance with the output voltage (Vo) and a predetermined reference voltage (Vref);

an oscillator (9) that is configured to generate a set signal (SET) at a predetermined switching frequency (Fsw); and a comparator (11) that is configured to generate the reset signal (RST) by comparing one of the error signal (Verr) and a control signal (Vc) in response to the error signal (Verr) and a ramp signal (Vr) to each other, in which the controller (12)

turns ON the switch device (1) in response to the set signal (SET) under a state in which the OFF-skip function is stopped, and turns OFF the switch device (1) in response to the reset signal (RST) under the state in which the OFF-skip function is stopped.

[Appendix 3] The power-supply control apparatus (100) according to Appendix 2, further including:

a current-detecting circuit (6) that is configured to generate a current-detecting signal (Isns) in accordance with current (IL2) which flows through the output stage (HB); and a second amplifier (7) that is configured to generate the control signal (Vc) in accordance with a difference between the error signal (Verr) and the current-detecting signal (Isns).

[Appendix 4] The power-supply control apparatus (100) according to any one of Appendices 1 to 3, further including a boot-strap circuit (BST) that is configured to generate a drive voltage (Vb) for the switch device (1) by charging a capacitor (C2) under a state in which the switch device (1) is turned OFF.

[Appendix 5] The power-supply control apparatus (100) according to Appendix 4, in which the controller (12) keeps the switch device (1) turned OFF at least over a minimum OFF period (Toff_min) at a time of turning OFF the switch device (1).

[Appendix 6] The power-supply control apparatus (100) according to any one of Appendices 1 to 5, in which the controller (12) includes a first D flip-flop (121) that is configured to accept input of a set signal (SET) via a clock end (>) of the first D flip-flop (121), accept input of a fixed voltage (Vdd) via a data end (D) of the first D flip-flop (121), accept input of the reset signal (RST) via a reset end (R) of the first D flip-flop (121), and output a first output signal (Q1) from an output end (Q) of the first D flip-flop (121), a second D flip-flop (122) that is configured to accept input of an inversion set signal (SETB) via a clock end (>) of the second D flip-flop (122),

accept input of the first output signal (Q1) via a data end (D) of the second D flip-flop (122), accept input of a power-ON reset signal (POR) via a reset end (R) of the second D flip-flop (122), and output a second output signal (Q2) from an output end (Q) of the second D flip-flop (122), an inverter (123) that is configured to generate the inversion set signal (SETB) by inverting a logic level of the set signal (SET), and a logic gate (124) that is configured to generate a duty control signal (S0) for the switch device (1) from the first output signal (Q1) and the second output signal (Q2).

[Appendix 7] A switched-mode power supply (A), including:

the power-supply control apparatus (100) according to any one of Appendices 1 to 6; and the output stage (HB) that is driven by the power-supply control apparatus (100).

[Appendix 8] The switched-mode power supply (A) according to Appendix 7, in which the switch device (1) is of an N-channel type.

[Appendix 9] The switched-mode power supply (A) according to Appendix 7 or 8, in which the output stage (HB) is of one of a step-down type, a step-up type, a step-up/down type, and an inversion type.

[Appendix 10] A vehicle (B), including:

the switched-mode power supply (A) according to any one of Appendices 7 to 9; and a battery that is configured to supply the input voltage (Vi) to the switched-mode power supply (A).

OTHERS

Note that, various technical features disclosed herein may be implemented as in the embodiments described hereinabove, or may be variously modified within the gist of the technical creation. In other words, the embodiments described hereinabove are merely examples, and hence should not be regarded as limitations. In addition, it should be understood that the technical scope of the present disclosure is defined by the scope of claims, and encompasses meaning of equivalents of the elements described in the scope of claims and all modifications within the scope of claims.

What is claimed is:

1. A power-supply control apparatus, comprising a controller that is configured to perform duty control on a switch device which forms an output stage of a switched-mode power supply which is configured to generate an output voltage from an input voltage, wherein the controller has an OFF-skip function to skip cyclic OFF transitions of the switch device, and keeps the switch device turned ON by ignoring a reset signal based on feedback control on the output voltage under a state in which the OFF-skip function is implemented.

2. The power-supply control apparatus according to claim 1, further comprising:

a first amplifier that is configured to generate an error signal in accordance with a difference between a feedback voltage in accordance with the output voltage and a predetermined reference voltage;

an oscillator that is configured to generate a set signal at a predetermined switching frequency; and a comparator that is configured to generate the reset signal by comparing one of the error signal and a control signal in response to the error signal and a ramp signal to each other, wherein the controller turns ON the switch device in response to the set signal under a state in which the OFF-skip function is stopped, and turns OFF the switch device in response to the reset signal under the state in which the OFF-skip function is stopped.

3. The power-supply control apparatus according to claim 2, further comprising:

a current-detecting circuit that is configured to generate a current-detecting signal in accordance with current which flows through the output stage; and a second amplifier that is configured to generate the control signal in accordance with a difference between the error signal and the current-detecting signal.

4. The power-supply control apparatus according to claim 1, further comprising a boot-strap circuit that is configured to generate a drive voltage for the switch device by charging a capacitor under a state in which the switch device is turned OFF.

5. The power-supply control apparatus according to claim 4, wherein the controller keeps the switch device turned OFF at least over a minimum OFF period at a time of turning OFF the switch device.

6. The power-supply control apparatus according to claim 1, wherein the controller includes a first D flip-flop that is configured to accept input of a set signal via a clock end of the first D flip-flop, accept input of a fixed voltage via a data end of the first D flip-flop, accept input of the reset signal via a reset end of the first D flip-flop, and output a first output signal from an output end of the first D flip-flop, a second D flip-flop that is configured to accept input of an inversion set signal via a clock end of the second D flip-flop, accept input of the first output signal via a data end of the second D flip-flop, accept input of a power-ON reset signal via a reset end of the second D flip-flop, and output a second output signal from an output end of the second D flip-flop, an inverter that is configured to generate the inversion set signal by inverting a logic level of the set signal, and a logic gate that is configured to generate a duty control signal for the switch device from the first output signal and the second output signal.

7. A switched-mode power supply, comprising:

the power-supply control apparatus according to claim 1; and the output stage that is driven by the power-supply control apparatus.

8. The switched-mode power supply according to claim 7, wherein the switch device is of an N-channel type.

9. The switched-mode power supply according to claim 7, wherein the output stage is of one of a step-down type, a step-up type, a step-up/down type, and an inversion type.

19

20

10. A vehicle, comprising:

the switched-mode power supply according to claim 7; and a battery that is configured to supply the input voltage to the switched-mode power supply.

\* \* \* \* \*